US010644687B2

(12) United States Patent
Schmidt

(10) Patent No.: US 10,644,687 B2
(45) Date of Patent: May 5, 2020

(54) CONTROL DEVICE FOR POWER SEMICONDUCTOR SWITCH

(71) Applicant: SEMIKRON ELEKTRONIK GMBH & CO. KG, Nuremberg (DE)

(72) Inventor: Jürgen Schmidt, Neunkirchen (DE)

(73) Assignee: SEMIKRON ELEKTRONIK GmbH & CO. KG, Nuremberg (DE)

( * ) Notice: Subject to any disclaimer, the term of this patent is extended or adjusted under 35 U.S.C. 154(b) by 0 days.

(21) Appl. No.: 16/362,810

(22) Filed: Mar. 25, 2019

(65) Prior Publication Data

US 2019/0305766 A1 Oct. 3, 2019

(30) Foreign Application Priority Data

Mar. 28, 2018 (DE) .......................... 10 2018 107 474

(51) Int. Cl.
*H03K 7/04* (2006.01)
*H03K 17/041* (2006.01)
(Continued)

(52) U.S. Cl.
CPC ........ *H03K 17/04106* (2013.01); *H02M 1/08* (2013.01); *H03K 3/012* (2013.01)

(58) Field of Classification Search
CPC .......................... H03K 17/04; H03K 17/04106
See application file for complete search history.

(56) References Cited

U.S. PATENT DOCUMENTS

| | | | | |
|---|---|---|---|---|
| 5,949,273 | A * | 9/1999 | Mourick | H03K 17/08128 327/324 |
| 7,679,425 | B2 * | 3/2010 | Miettinen | H03K 17/168 327/108 |

(Continued)

FOREIGN PATENT DOCUMENTS

| | | |
|---|---|---|
| EP | 2 242 179 | 4/2010 |
| EP | 2 434 627 | 5/2010 |
| WO | WO 2017/221417 | 12/1917 |

OTHER PUBLICATIONS

DE 10 2018 107 474.3 Office Action dated Feb. 21, 2019, German—8 pages; English 5-pages.

*Primary Examiner* — Hai L Nguyen
(74) *Attorney, Agent, or Firm* — Lackenbach Siegel, LLP; Andrew F. Young

(57) ABSTRACT

A control device for a power semiconductor switch, includes an actuating device, a first current path, a second current path, which connects the second output of the actuating device to a circuit node of the control device in an electrically conductive manner, wherein the second current path incorporates an electrical switching off resistor which is electrically connected in-circuit between a second output of the actuating device and the circuit node of the control device, a third current path, which connects the circuit node of the control device to a control device terminal of the control device in an electrically conductive manner, and an switching off acceleration circuit, which is electrically connected in parallel with the switching off resistor, comprising a diode, an electrical resistor, and a capacitor which is electrically connected in parallel with said resistor, wherein the cathode of the diode is connected to a second electrical terminal of the capacitor in an electrically conductive manner, and a first electrical terminal of the capacitor is connected to a first terminal of the switching off resistor, which is electrically oriented towards the actuating device in an electrically conductive manner, and the anode of the diode is connected to a second electrical terminal of the switching off resistor in an electrically conductive manner.

6 Claims, 1 Drawing Sheet

(51) Int. Cl.
*H02M 1/08* (2006.01)
*H03K 3/012* (2006.01)

(56) References Cited

U.S. PATENT DOCUMENTS

| | | | |
|---|---|---|---|
| 8,471,622 B2* | 6/2013 | Ishikawa | H03K 17/08128 327/108 |
| 2008/0122497 A1 | 5/2008 | Ishikawa et al. | |
| 2014/0191784 A1 | 7/2014 | Hatanaka et al. | |

* cited by examiner

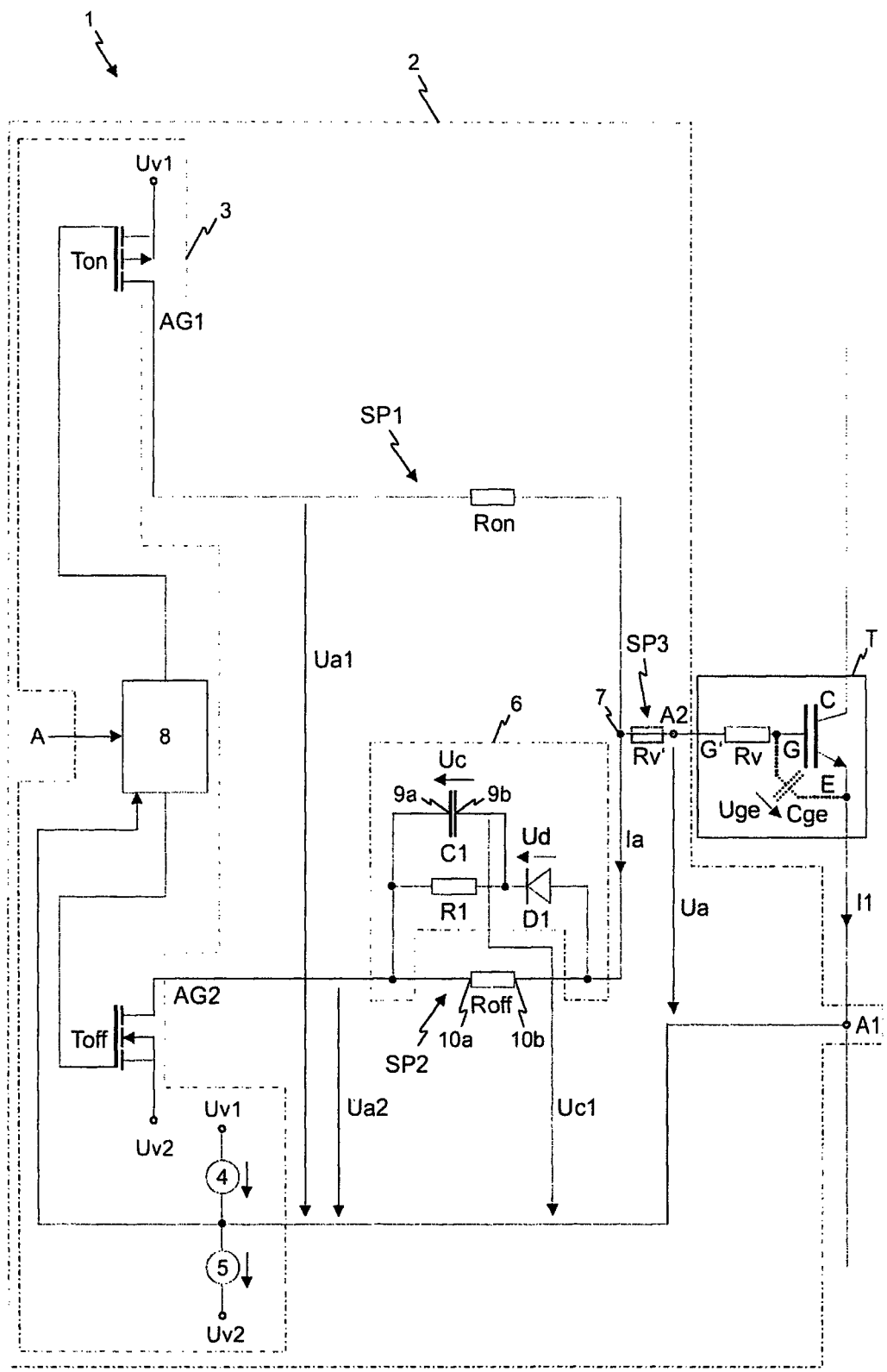

CONTROL DEVICE FOR POWER SEMICONDUCTOR SWITCH

CROSS REFERENCE TO RELATED APPLICATIONS

This application relates to, and claims priority from, DE Ser. No.: 10 2018 107 474.3 filed Mar. 28, 2018, the entire contents of which are incorporated herein by reference.

FIGURE SELECTED FOR PUBLICATION

FIG. 1.

BACKGROUND OF THE INVENTION

Field of the Invention

The present invention relates to a control device for a power semiconductor switch.

Description of the Related Art

A control device for a power semiconductor switch is known from EP 2 434 627 A1, having an actuating device, which is designed, in accordance with a control signal, to generate a first actuating voltage for the switching on of the power semiconductor switch on its first output, and to generate a second actuating voltage for the switching off of the power semiconductor switch on its second output, in a mutually alternating manner. The first actuating voltage is fed via an electrical switching on resistor and the second actuating voltage is fed via an electrical switching off resistor to the control terminal of the power semiconductor switch.

In power electronics, e.g. as represented in FIG. 2 of EP 2 434 627 A1, in many cases, two power semiconductor switches are respectively electrically connected in series to constitute a half-bridge circuit. The two power semiconductor switches are switched off and switched on in a mutually alternating manner. In order to prevent a short-circuit of the half-bridge circuit, associated with the mutually alternating switching on and switching off of the two power semiconductor switches, both power semiconductor switches must be simultaneously switched off for a given time interval, which should be as short as possible, also described technically as "dead time". In order to maintain the dead time as short as possible, it is technically desirable that, on the respective actuating device, with the power semiconductor switch switched on, the time interval from time point t0 at which, on its first output, the first actuating voltage for the switching on of the power semiconductor switch is no longer generated and, on its second output, the second actuating voltage for the switching off of the power semiconductor switch commences to be generated, to time point t2, at which the power semiconductor switch is switched off, should be as short as possible.

In order to maintain this time interval as short as possible, it is known for the resistance of the electrical switching off resistor to be rated to a relatively low value, such that the gate-emitter capacitance of the power semiconductor switch is discharged via the switching off resistor as rapidly as possible. It is disadvantageous, however, that the power semiconductor switch is switched off with a high switching off speed, such that the load current flowing in the power semiconductor switch shows a high rate of current variation which, as a result of stray inductances in conductors which are electrically connected to its load terminals, generates high electrical voltages between the load current terminals of the power semiconductor switch, which can potentially result in the damage or destruction of the power semiconductor switch.

ASPECTS AND SUMMARY OF THE INVENTION

The object of the invention is the provision of a reliable control device for a power semiconductor switch which, in a half-bridge circuit, permits the achievement of a short dead time.

This object is fulfilled by a control device for a power semiconductor switch, having a first and a second load current terminal and a control terminal, comprising:
a first electrical control device terminal, which is provided for electrical connection with the first load current terminal,
a second electrical control device terminal, which is provided for electrical connection with the control terminal,
an actuating device which is designed, in accordance with a control signal, to generate a first actuating voltage on its first output for the switching on of the power semiconductor switch, and to generate a second actuating voltage on its second output for the switching off of the power semiconductor switch, in a mutually alternating manner,
a first current path, which connects the first output of the actuating device to a circuit node of the control device in an electrically conductive manner,
a second current path, which connects the second output of the actuating device to the circuit node of the control device in an electrically conductive manner, wherein the second current path incorporates an electrical switching off resistor which is electrically connected in-circuit between the second output of the actuating device and the circuit node of the control device,
a third current path, which connects the circuit node of the control device to the second control device terminal in an electrically conductive manner, and
an switching off acceleration circuit, which is electrically connected in parallel with the switching off resistor, comprising a diode, an electrical resistor, and a capacitor which is electrically connected in parallel with said resistor, wherein the cathode of the diode is connected to a second electrical terminal of the capacitor in an electrically conductive manner, and a first electrical terminal of the capacitor is connected to a first electrical terminal of the switching off resistor, which is electrically oriented towards the actuating device, in an electrically conductive manner, and the anode of the diode is connected to a second electrical terminal of the switching off resistor in an electrically conductive manner.

It has proved to be advantageous if the resistance value of the resistor in the switching off acceleration circuit is at least 10% greater than the resistance value of the switching off resistor, given that, where the diode is conductive, the current flowing through the resistor of the switching off acceleration circuit is then relatively low.

It has moreover proved to be advantageous if the power semiconductor switch incorporates an electrical gate series resistor which is integrated in said power semiconductor switch, as the power semiconductor circuit can then be configured to an exceptionally compact design.

It has moreover proved to be advantageous if the third current path incorporates an electrical actuating gate series resistor, which is electrically connected between the circuit node of the actuating device and the second control device terminal, as the control device can then be exceptionally effectively adapted to the power semiconductor switch.

It has further proved to be advantageous if the first current path incorporates an electrical switching on resistor, which is electrically connected between the first output of the actuating device and the circuit node of the control device, as the control device can then be exceptionally effectively adapted to the power semiconductor switch.

Moreover, a power semiconductor circuit having a control device according to the invention for the power semiconductor switch has proved to be advantageous, wherein the first control device terminal is connected to the first load current terminal of the power semiconductor switch in an electrically conductive manner, and the second control device terminal is connected to the control terminal of the power semiconductor switch in an electrically conductive manner.

The above and other aspects, features and advantages of the present invention will become apparent from the following description read in conjunction with the accompanying drawings, in which like reference numerals designate the same elements.

BRIEF DESCRIPTION OF THE DRAWINGS

FIG. 1 shows a power semiconductor circuit having a power semiconductor switch and having a control device according to the invention for the power semiconductor switch.

DETAILED DESCRIPTION OF THE PREFERRED EMBODIMENTS

Reference will now be made in detail to embodiments of the invention. Wherever possible, same or similar reference numerals are used in the drawings and the description to refer to the same or like parts or steps. The drawings are in simplified form and are not to precise scale. The word 'couple' or 'link' or 'connect' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

In the present text, numerous specific details are set forth in order to provide a thorough understanding of exemplary versions of the present invention. It will be apparent, however, to one skilled in the art, that some versions of the present invention may possibly be practiced without some of these specific details. Indeed, reference in this specification to "a variant," "variants," preference, and "one/the variant," or "one version" and the like, should be understood to mean that a particular feature, structure, or characteristic described in connection with the variant or version is included in at least one such variant or version according to the disclosure.

Thus, the appearances of phrases such as "in one variant," "in one version," and the like, in various places in the specification are not necessarily all referring to the same version or variant, nor are separate or alternative versions or variants mutually exclusive of other versions or variants. Moreover, various features may be described which possibly may be exhibited by some variants or versions and not by others. Similarly, various requirements are described which may be requirements for some variants or versions, but not others. Furthermore, as used throughout this specification, the terms 'a', 'an', 'at least' do not denote a limitation of quantity, but rather denote the presence of at least one of the referenced item, in the sense that singular reference of an element does not necessarily exclude the plural reference of such elements. Concurrently, the term "a plurality" denotes the presence of more than one referenced items. Finally, the terms "connected" or "coupled" and related terms are used in an operational sense and are not necessarily limited to a direct connection or coupling.

Various operations may be described as multiple discrete operations in turn, in a manner that may be helpful in understanding embodiments of the present invention; however, the order of description should not be construed to imply that these operations are order dependent.

FIG. 1 represents a power semiconductor circuit 1 having a power semiconductor switch T and having a control device 2 according to the invention for the power semiconductor switch T.

The power semiconductor switch T comprises a first and a second load current terminal E and C, and a control terminal G'.

The power semiconductor sub-switch T is preferably provided in the form of a transistor, such as e.g. an IGBT (Insulated Gate Bipolar Transistor) or a MOSFET (Metal Oxide Semiconductor Field Effect Transistor). In the context of the exemplary embodiment, the power semiconductor switch T is provided in the form of an IGBT, wherein the second load current terminal C is provided in the form of the collector of the IGBT, and the first load current terminal E is provided in form of the emitter of the IGBT. In the context of the exemplary embodiment, the power semiconductor switch T incorporates a gate series resistor Rv, which is integrated in the power semiconductor switch T and connected to the gate G of the power semiconductor switch T in an electrically conductive manner, such that the control terminal G' of the power semiconductor switch T is not provided directly in the form of the gate G of the power semiconductor switch T, but in the form of an electrical terminal of the gate series resistor Rv which is electrically averted from the gate G.

The control device 2 comprises a first electrical control device terminal A1, which is provided for electrical connection to the first load current terminal E of the power semiconductor switch T, and a second electrical control device terminal A2, which is provided for electrical connection to the control terminal G' of the power semiconductor switch T.

The first control device terminal A1, in the power semiconductor circuit 1, is electrically connected to the first load current terminal E of the power semiconductor switch T, and the second control device terminal A2 is electrically connected to the control terminal G' of the power semiconductor switch T.

The control device 2 comprises an actuating device 3 which is designed, in accordance with a control signal A, which is generated e.g. by a superordinate control circuit (not represented), to generate a first actuating voltage Ua1 on its first output AG1 for the switching on of the power semiconductor switch T, and to generate a second actuating voltage Ua2 on its second output AG2 for the switching off of the power semiconductor switch T, in a mutually alternating manner. In the exemplary embodiments, the actuating device 3 generates a first actuating voltage Ua1 of 15V for the switching on of the power semiconductor switch T, and a second actuating voltage Ua2 of −8V for the switching off of the power semiconductor switch T. The actuating device 3 comprises a first actuating transistor Ton, a second actuating control transistor Toff, a first and a second voltage source 4 and 5, and a transistor actuating device 8 which, in accordance with the control signal A, switches on and switches off the first and second actuating transistors Ton and Toff in a mutually alternating manner, i.e. if the first actuating control transistor Ton is switched on, then the second actuating control transistor Toff is switched off and vice versa. If, in the exemplary embodiment, the control signal A assumes a logic value "1", then the first actuating transistor Ton is switched on and the second actuating transistor Toff is switched off, and if the control signal A assumes a logic value "0", then the first actuating transistor Ton is switched off and the second actuating transistor Toff is switched on.

The first actuating control transistor Ton, upon the switching on thereof, connects the first voltage source 4, which generates a switching on voltage Uv1, in this case 15V, in an electrically conductive manner to a first current path SP1 of the control device 2, which connects the first output AG1 of the actuating device 3 to a circuit node 7 of the control device 2 in an electrically conductive manner. The first current path SP1 preferably incorporates an electrical switching on resistor Ron, which is electrically connected in-circuit between the first output AG1 of the actuating device 3 and the circuit node 7 of the control device 2.

The second actuating control transistor Toff, upon the switching on thereof, connects the second voltage source 5, which generates an switching off voltage Uv2, in this case −8V, in an electrically conductive manner to a second current path SP2 of the control device 2, which connects the second output AG2 of the actuating device 3 to the circuit node 7 of the control device 2 in electrically conductive manner. The second current path SP2 incorporates an electrical switching off resistor Roff, which is electrically connected in-circuit between the second output AG2 of the actuating device 3 and the circuit node 7 of the control device 2.

The control device 2 further comprises a third current path SP3, which connects the circuit node 7 to the second control device terminal A2 in an electrically conductive manner and thus, in the exemplary embodiment, to the control terminal G' of the power semiconductor switch T in an electrically conductive manner.

The control device 2 according to the invention additionally comprises an switching off acceleration circuit 6 which is electrically connected in parallel with the switching off resistor Roff. The switching off acceleration circuit 6 comprises a diode D1, an electrical resistor R1, and a capacitor C1 which is electrically connected in parallel with said resistor R1. The cathode of the diode D1 is connected to a second electrical terminal 9b of the capacitor C1 in an electrically conductive manner, and a first electrical terminal 9a of the capacitor C1 is connected in an electrically conductive manner to a first electrical terminal 10a of the switching off resistor Roff, which is electrically oriented towards the actuating device 3. The anode of the diode D1 is connected to a second electrical terminal 10b of the switching off resistor Roff in an electrically conductive manner. A first electrical terminal of the resistor R1 is connected to the first terminal 9a of the capacitor C1 in an electrically conductive manner, and a second electrical terminal of the resistor R1 is connected to the second terminal 9b of the capacitor C1 in an electrically conductive manner.

The mode of operation of the control device 2 according to the invention, and specifically of the switching off acceleration circuit 6, is described hereinafter, wherein the description of the mode of the operation of the control device 2 according to the invention assumes a state in which the first actuating control transistor Ton is switched on the second actuating control transistor Toff is switched off, and the gate-emitter capacitance Cge of the power semiconductor switch T is charged to the voltage value of the switching on voltage Uv1, in this case 15V, i.e. the gate-emitter voltage Uge is equal to 15V, and the power semiconductor switch T is thus switched on. In this initial state, the capacitor C1 is discharged, such that the capacitor voltage Uc of the capacitor C1 is equal to 0V.

At time point t0, the transistor actuating device 8, in response to a corresponding variation in the value of the actuating signal A (from logic value "1" to logic value "0"), switches off the first actuating control transistor Ton, and switches on the second actuating control transistor Toff. The actuating device 3 accordingly generates, at its second output AG2, a second actuating voltage Ua2 for the switching off of the power semiconductor switch, which corresponds to the voltage value of the switching off voltage Uv1, in this case −8V, wherein the voltage drop across the second actuating control transistor Toff is ignored.

If the switching on acceleration circuit 6 according to the invention were not present, then the gate-emitter capacitance Cge of the power semiconductor switch T would be exclusively discharged, relatively slowly, via the electrical series circuit comprised of the gate series resistor Rv and the switching off resistor Roff of the actuating device 3, more specifically of the second voltage source 5, such that, with effect from time point t0, a relatively long time interval T1 elapses until the gate-emitter capacitance Cge of the power semiconductor switch T, at a time point t2, is discharged to the extent that the power semiconductor switch T is switched off. In order to maintain this time interval T1 as short as possible, it is known for the resistance of the electrical switching off resistor Roff to be rated to a relatively low value, such that the gate-emitter capacitance Cge of the power semiconductor switch T is discharged via the electrical series circuit comprised of the gate series resistor Rv and the switching off resistor Roff as rapidly as possible. It is disadvantageous, however, that the power semiconductor switch T is switched off with a high switching off speed, such that the load current I1 flowing through the power semiconductor switch T shows a high rate of current variation which, as a result of stray inductances in conductors which are electrically connected to its first and second load current terminals E and C, generates high electrical voltages between said load current terminals E and C of the power semiconductor switch T, which can result in the damage or destruction of the power semiconductor switch T.

According to the invention, at time point to, at which the first actuating control transistor Ton is switched off and the second actuating control transistor Toff is switched on, the capacitor terminal voltage Uc1 on the second terminal 9b of the capacitor C1 executes a step change to the voltage value of the second actuating voltage Ua2, i.e. to −8V in the exemplary embodiment, as the capacitor voltage Uv at time point t0 is equal to 0V. At time point t0, in the exemplary embodiment, the gate-emitter voltage Uge is 15V, such that, with effect from time point t0, the gate-emitter capacitance Cge of the power semiconductor switch T is discharged with a high discharge current Ia, and the capacitor C1 is rapidly charged via the diode D1. A proportion of the electrical energy stored in the gate-emitter capacitance Cge is transferred to the capacitor C1. The resulting discharge current Ia is significantly higher than the discharge current Ia, which would occur, were the switching off acceleration circuit 6 not present. As the electrical charging of the capacitor C1 increases, the capacitor terminal voltage Uc1 rises, and the gate-emitter voltage Uge decays. If the voltage difference between the gate-emitter voltage Uge and the capacitor terminal voltage Uc1, which is present as the diode voltage Ud across the diode D1 at time point t1, falls below a specific minimum value, in this case 0.7V, the diode D1 becomes non-conductive and the discharge current Ia falls, as the further discharging of the gate-emitter capacitance Cge is then executed exclusively via the electrical series circuit comprised of the gate series resistor Rv and the switching off resistor Roff. Preferably, the value of the gate-emitter voltage Uge at time point t1 is still sufficiently high, in the exemplary embodiment 7.5V, such that the power semiconductor switch T is still switched on. After time point t1, further discharge of the gate-emitter capacitance Cge proceeds exclusively via the electrical series circuit comprised of the gate series resistor Rv and the second actuating control transistor Toff of the second voltage source 5, such that further discharge does not proceed with a very high discharge current Ia, and further discharge thus proceeds relatively slowly, such that the power semiconductor switch T, in its switching off process, i.e. upon the transition from an electrically-conductive to a non-electrically-conductive state, does not show a high switching off speed and, accordingly, upon the switching off of the power semiconductor switch T, rates of current variation in the load current I1 are not very high.

The resistance value of the resistor R1 and the capacitance of the capacitor C1 of the switching off acceleration circuit 6 preferably assume a value such that the gate-emitter capacitance Cge, immediately after the commencement t0 of the generation of the second actuating voltage Ua2 and pending the switching off of the power semiconductor switch T by the switching off acceleration circuit 6, is only partially discharged. The resistance value of the resistor R1 and the capacitance of the capacitor C1 of the switching off acceleration circuit 6 preferably assume a value such that the gate-emitter capacitance Cge of the power semiconductor switch T, immediately after the commencement of the generation of the second actuating voltage Ua2 for the switching off of the power semiconductor switch T, and pending a specific time point t1, is discharged to a level such that the power semiconductor switch T is still switched on, and specifically is still switched on such that, with effect from this specific time point t1, the gate-emitter capacitance Cge of the power semiconductor switch T is not discharged further by the switching off acceleration circuit 6.

The resistor R1 of the switching off acceleration circuit 6 discharges the capacitor C1, at the latest, up to the time point at which the actuating device 3, upon the mutually alternating switching on and switching off of the power semiconductor switch T, next commences to generate a second actuating voltage Ua2 for the switching off of the power semiconductor switch T of the switching off acceleration circuit 6, such that the capacitor C1, at the latest, is further discharged up to this time point. The resistance value of the resistor R of the switching off acceleration circuit 6 is preferably at least 10% greater than the resistance value of the switching off resistor Roff.

The resistance value of the switching off resistor Roff is preferably 0.5Ω to 20Ω, wherein, in the exemplary embodiment, this value is 8.75Ω. The resistance value of the switching on resistor Ron is preferably 1Ω to 10Ω, wherein, in the exemplary embodiment, this value is 1.5Ω. The resistance value of the resistor R1 of the switching off acceleration circuit 6 is preferably 5Ω to 30Ω, wherein, in the exemplary embodiment, this value is 15Ω. The capacitance of the capacitor C1 of the switching off acceleration circuit 6 is preferably 20 nF to 300 nF, wherein, in the exemplary embodiment, this value is 100 nF. The resistance value of the electrical gate series resistor Rv which is integrated in the power semiconductor switch T is preferably 1Ω to 20Ω, wherein, in the exemplary embodiment, this value is 2.3Ω.

Given that, in the case of the invention, the load current I1 during the switching off process of the power semiconductor switch T does not assume any high rate of current variation, as a result of stray inductances in the conductors which are electrically connected to the load terminals E and C of the power semiconductor switch T, any electrical voltages between the load current terminals of the power semiconductor switch are relatively low, notwithstanding the fact that, with effect from time point t0, only a relatively short time interval T1 elapses until the gate-emitter capacitance Cge of the power semiconductor switch T, at a time point t2, is discharged to the extent that the power semiconductor switch T is switched off.

The third current path SP3, alternatively or additionally to the electrical gate series resistor Rv which is integrated in the power semiconductor switch T, incorporates an electrical actuating gate series resistor Rv', which is electrically connected in-circuit between the circuit node 7 of the actuating device 3 and the second control device terminal A2, and is represented in FIG. 1 by broken lines. The resistance value of the actuating gate series resistor Rv is preferably 1Ω to 20Ω.

It will be observed that the power semiconductor circuit 1 does not necessarily need to incorporate the gate series resistor Rv or the actuating gate series resistor Rv'.

It will further be observed that, naturally, characteristics of various exemplary embodiments of the invention, provided that said characteristics are not mutually exclusive, can be mutually combined as required, without departing from the scope of the invention.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A control device for a power semiconductor switch, having a first and a second load current terminal and a control terminal, comprising:
   a first electrical control device terminal, provided for electrical connection with the first load current terminal;
   a second electrical control device terminal, provided for electrical connection with the control terminal;

an actuating device, which is designed, in accordance with a control signal (A), to generate a first actuating voltage on its first output for the switching on of the power semiconductor switch, and to generate a second actuating voltage on its second output for the switching off of the power semiconductor switch, in a mutually alternating manner;

a first current path, which connects the first output of the actuating device to a circuit node of the control device in an electrically conductive manner;

a second current path, which connects the second output of the actuating device to the circuit node of the control device in an electrically conductive manner, wherein the second current path incorporates an electrical switching off resistor (Roff) which is electrically connected in-circuit between the second output of the actuating device and the circuit node of the control device;

a third current path, which connects the circuit node of the control device to the second control device terminal in an electrically conductive manner; and an switching off acceleration circuit, which is electrically connected in parallel with the switching off resistor (Roff), comprising a diode, an electrical resistor, and a capacitor which is electrically connected in parallel with said resistor, wherein the cathode of the diode is connected to a second electrical terminal of the capacitor in an electrically conductive manner, and a first electrical terminal of the capacitor is connected to a first electrical terminal of the switching off resistor (Roff), which is electrically oriented towards the actuating device in an electrically conductive manner, and the anode of the diode is connected to a second electrical terminal of the switching off resistor (Roff) in an electrically conductive manner.

2. The control device, according to claim 1, wherein:
the resistance value of the resistor in the switching off acceleration circuit is at least 10% greater than the resistance value of the switching off resistor.

3. The control device according to claim 1, wherein:
the power semiconductor switch incorporates an electrical gate series resistor which is integrated in said power semiconductor switch.

4. The control device according to claim 1, wherein:
the third current path incorporates an electrical actuating gate series resistor which is electrically connected between the circuit node of the actuating device and the second control device terminal.

5. The control device according to claim 1, wherein:
the first current path incorporates an electrical switching on resistor, which is electrically connected between the first output of the actuating device and the circuit node of the control device.

6. A power semiconductor circuit, having a power semiconductor switch and having a control device for said power semiconductor switch, which is configured according to claim 1, wherein:
the first control device terminal is connected to the first load current terminal of the power semiconductor switch in an electrically conductive manner, and the second control device terminal is connected to the control terminal of the power semiconductor switch in an electrically conductive manner.

* * * * *